US008115107B2

(12) United States Patent
Behziz

(10) Patent No.: US 8,115,107 B2
(45) Date of Patent: Feb. 14, 2012

(54) SYSTEM AND METHOD FOR MOUNTING SHIELDED CABLES TO PRINTED CIRCUIT BOARD ASSEMBLIES

(75) Inventor: Arash Behziz, Thousand Oaks, CA (US)

(73) Assignee: Treadyne, Inc., North Reading, MA (US)

( * ) Notice: Subject to any disclaimer, the term of this patent is extended or adjusted under 35 U.S.C. 154(b) by 698 days.

(21) Appl. No.: 12/195,928

(22) Filed: Aug. 21, 2008

(65) Prior Publication Data

US 2009/0225526 A1 Sep. 10, 2009

Related U.S. Application Data

(60) Provisional application No. 60/957,350, filed on Aug. 22, 2007.

(51) Int. Cl.
*H01R 9/05* (2006.01)
*H01R 12/53* (2011.01)

(52) U.S. Cl. .......... 174/261; 174/250; 29/832; 361/760; 439/63

(58) Field of Classification Search .......... 174/250–251, 174/261; 29/828, 832, 840; 361/748, 760; 439/63, 579, 581
See application file for complete search history.

(56) References Cited

U.S. PATENT DOCUMENTS

| | | | | |
|---|---|---|---|---|
| 3,910,655 | A * | 10/1975 | Willison et al. | 384/423 |
| 5,516,303 | A * | 5/1996 | Yohn et al. | 439/248 |
| 6,380,485 | B1 * | 4/2002 | Beaman et al. | 174/88 R |
| 6,468,089 | B1 * | 10/2002 | Hubbard et al. | 439/63 |
| 6,515,499 | B1 | 2/2003 | Parrish et al. | |
| 6,686,732 | B2 | 2/2004 | Parrish | |
| 6,808,395 | B2 | 10/2004 | Lin et al. | |
| 6,837,741 | B2 * | 1/2005 | Kuwahara | 439/497 |
| 6,843,657 | B2 * | 1/2005 | Driscoll et al. | 439/65 |
| 6,910,897 | B2 * | 6/2005 | Driscoll et al. | 439/65 |
| 6,939,175 | B2 * | 9/2005 | Parrish et al. | 439/620.03 |
| 7,180,321 | B2 * | 2/2007 | Behziz et al. | 324/756.07 |
| 7,575,474 | B1 * | 8/2009 | Dodson et al. | 439/581 |
| 7,793,415 | B2 * | 9/2010 | Vitt et al. | 29/868 |
| 7,977,583 | B2 * | 7/2011 | Yaghmai et al. | 174/350 |
| 2006/0071680 | A1 | 4/2006 | Behziz et al. | |

FOREIGN PATENT DOCUMENTS

JP 11026045 A * 1/1999

* cited by examiner

*Primary Examiner* — Robert J Hoffberg
(74) *Attorney, Agent, or Firm* — Wolf, Greenfield & Sacks, P.C.

(57) ABSTRACT

Methods and apparatus are provided for securely and cost effectively attaching one or more shielded cables to a planar substrate. A cable assembly includes a printed circuit board (PCB) coupled to a distal end of the one or more shielded cables. Perpendicular alignment of the distal cable ends promotes a dense array that is achieved using angular mounting brackets for coupling cable shields to electrical contacts on an engagement surface of the PCB. Mounting brackets are attached between the cable shield and shield contacts using electrically conductive attachment techniques including soldering and laser welding. The PCB also includes one or more signal contacts for each cable. Distal ends of the internal conductors are each bent about 90 degrees from the vertical cable axis to align with the horizontal engagement surface. Internal conductors are surface mounted to their respective signal contact using one or more of soldering and laser welding.

20 Claims, 12 Drawing Sheets

SYSTEM AND METHOD FOR MOUNTING SHIELDED CABLES TO PRINTED CIRCUIT BOARD ASSEMBLIES

RELATED APPLICATION

This application claims the benefit of U.S. Provisional Application No. 60/957,350, filed on Aug. 22, 2007, the entire teachings of which are herein incorporated by reference.

FIELD OF THE INVENTION

The embodiments herein generally relate to shielded cable assemblies and more particularly to a shielded cable interface module for a high-performance semiconductor tester interface.

BACKGROUND

Automatic test equipment (ATE) employed in the functional test of semiconductor devices can include a number of channel cards generating a multitude of electrical test signals directed to a semiconductor device under test (DUT). The test signals are routed through a semiconductor interface, such as a probe card for contacting electrical interconnects on the DUT. Often times, the test signals operate at high frequencies ranging from hundreds of megahertz to gigahertz. To achieve efficient signal distribution while controlling signal interference, shielded cables are typically employed.

Routing of test signals from the channel cards to the probe card often requires that the shielded cables be brought into closer and closer proximity with each other. Such compact routing is due at least in part to the small scale of the DUTs. An interface is typically provided between a distal end of the shielded cables to terminate the cables and route the signals to the probe card or interposer. Others have proposed cable terminations for such applications.

SUMMARY

What is needed is a method of manufacturing an assembly for interconnecting a plurality of shielded cables to a planar substrate. The method may be adapted for interfacing to a semiconductor device under test through an interposer. The assembly should accommodate a dense array of shielded cables capable of accommodating high-frequency signals while maintaining a high fidelity.

Various embodiments can provide an apparatus and method for manufacture for securely attaching at least one shielded cable to a planar substrate, such that a distal end of the shielded cable is aligned substantially perpendicular to the planar substrate. Substantially perpendicular alignment allows multiple shielded cables to be attached to the planar substrate, such as a printed circuit board, forming a dense array of shielded cables that is well suited to space restrictions encountered in semiconductor test applications.

In one aspect, the embodiments relate to a process for attaching a distal end of a shielded cable to an engagement surface of a planar substrate without using a connector. The shielded cable has at least one internal conductor and an external shield conductor. A first portion of an electrically conductive mounting bracket is attached to the engagement surface. A distal end of the internal conductor is bent such that the distal end is substantially perpendicular to a central axis of the shielded cable. The distal end of the internal conductor is attached to the engagement surface, such that the central axis of the shielded cable is not parallel to the engagement surface. In some embodiments, the distal end of the shielded cable is substantially perpendicular to the engagement surface. A distal portion of the external shield conductor is attached to the first portion of the electrically conductive mounting bracket. A second portion of an electrically conductive mounting bracket is also attached to the distal portion of the external shield conductor and the engagement surface. The distal end of the shielded cable is securely attached to the engagement surface at least in part through attachments of the distal ends of the internal conductor and the external shield conductor.

In another aspect, the embodiments relate to a shielded cable assembly comprising a planar substrate including an engagement surface. The engagement surface has at least one electrically conductive signal contact and at least one separate electrically conductive shield contact. The assembly includes a shielded cable having at least one internal conductor and an external shield conductor. A distal end of the internal conductor extends beyond a distal end of the external shield conductor. The distal end of the internal conductor includes a bend that is attached to and in electrical communication with the electrically conducting signal contact. The assembly also includes an electrically conducting mounting bracket. The mounting bracket is attached between and in electrical communication with each of the distal end of the external shield conductor and the electrically conductive shield contact. A distal end of the shielded cable is securely attached to and perpendicularly aligned with the engagement surface without using a connector.

In another aspect, the embodiments relate to an automatic test equipment (ATE) interface for coupling high-frequency tester channels to a device-under test. The interface includes a printed circuit board having a first planar surface and a second opposing planar surface. The first planar surface includes multiple signal contacts and shield contacts. The interface also includes multiple shielded cables, with each of the shielded cables having at least one internal conductor and an external shield conductor. A distal end of each of the shielded cables is perpendicularly aligned with the planar surface of the printed circuit board. A distal end of the at least one internal conductors is aligned with the planar surface. The interface also includes multiple electrically conducting mounting brackets. Each of the mounting brackets is coupled between a distal end of at least one of the shielded cables and at least one of the shield contacts. The electrically conducting mounting brackets support perpendicular alignment of the shielded cables coupled thereto without using connectors. The ATE interface couples high-frequency tester channels to a device-under test through the multiple shielded cables.

In yet another aspect, the embodiments relate to a shielded cable assembly including means for attaching a first portion of an electrically conductive mounting bracket to an engagement surface. A distal end of the internal conductor is bent substantially perpendicular to a central axis of the shielded cable. The assembly includes means for attaching the bent distal end of the internal conductor to the engagement surface, such that the central axis of the shielded cable is substantially perpendicular to the engagement surface. Means for attaching a distal portion of the external shield conductor to the first portion of the electrically conductive mounting bracket are also provided, as are means for attaching a second portion of an electrically conductive mounting bracket to the distal portion of the external shield conductor and the engagement surface. The vertically aligned end of the shielded cable is securely attached to the engagement surface.

An advantage of non-parallel orientations in the shielded cable assembly is that more shielded cable terminations can be accommodated per unit surface area which allows for a space savings that can accommodate a dense signal routing, useful in semiconductor test applications. Another advantage of perpendicular fashion of the mounting bracket in the shielded cable assembly is that the perpendicular alignment of the distal end of the shielded cable to the surface is promoted which increases the efficiency of the electrical conductive path therebetween.

An additional advantage of the shielded cable assembly is that the funneling of large arrays of conductors from a low-density array to a high-density array is efficiently manufactured. Another advantage of the shielded cable assembly is that impedance-matched transmission lines with low dielectric are utilized as signal conductors which maximizes signal fidelity over a wide bandwidth passing beyond several gigahertz.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
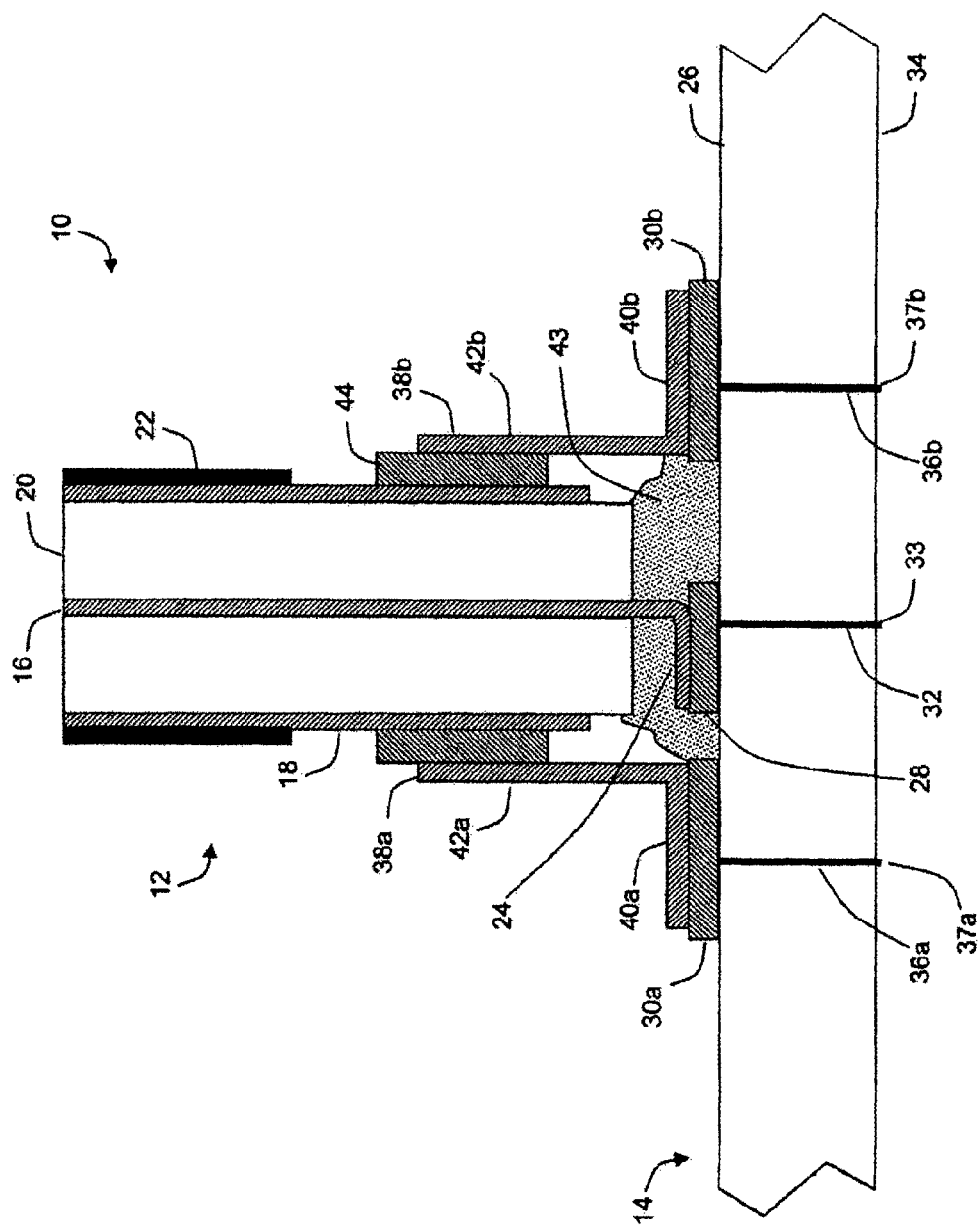
FIG. 1 is a cross-sectional view of an exemplary embodiment of a shielded cable assembly in accordance with the principles of the present embodiments.

Referring to FIG. 1, a cross-sectional view of an exemplary embodiment of a shielded cable assembly 10 is shown. The assembly 10 includes at least one shielded cable 12 having a distal end attached to a planar substrate 14. The shielded cable 12 includes at least one internal electrical conductor, or signal conductor 16 electrically insulated from an electrically conductive shield conductor 18. One or more electrically insulating layers 20 are disposed between the signal conductor 16 and shield conductor 18. In some embodiments, an external cable jacket 22 surrounds the signal and shield conductors 16, 18 electrically insulating the shielded cable 12.

Prior to attachment, the distal end of each shielded cable 12 is prepared by removing a portion of the cable jacket 22 to expose a distal portion of the shield conductor 18. A distal portion of the shield conductor 18 and the electrical insulation 20 is also removed to expose a distal portion of the signal conductor 16. To promote surface attachment to the planar substrate 14, a distal end portion 24 of the exposed signal conductor 16 is bent. Preferably, the bend is about 90 degrees measured from the cable axis, such that the bent end portion 24 is parallel to an engagement surface 26 of the planar substrate 14, while the distal end of the shielded cable 12 is perpendicular to the engagement surface 26. Surface attachment of the shielded cable 12 to the engagement surface 26 avoids the need for through bores for at least the one signal conductors 16 and shield conductor 18. Avoiding through bores sized for cable conductors 16, 18 promotes control of physical surface contours on a second opposing surface 34. Namely, surface protrusions and discontinuities that might otherwise result from protruding cable conductors 16, 18 are avoided allowing for the smoother second opposing surface 34. A smooth surface 34 with controlled contacts 33, 37a, 37b is better adapted for abutting an interposer as used in semiconductor test applications.

In some embodiments, the planar substrate is a printed circuit board 14 including a respective electrically conductive signal contact 28 for each of the one or more signal conductors 16 and at least one electrically conductive shield contact 30a, 30b (generally "30"). Each signal contact 28 respectively includes an electrically conductive signal path 32 extending from the engagement surface 26 to a second opposing surface 34 of the printed circuit board 14. Each signal path 32 is in electrical communication with the respective signal contact 28. Similarly, each of the at least one of the shield contacts 30 respectively includes at least one electrically conductive shield path 36a, 36b (generally "36") extending from the engagement surface 26 to the second opposing surface 34 of the printed circuit board 14. Each of the at least one shield paths 36 is also in electrical communication with the respective shield contact 30a, 30b.

At least one electrically conductive mounting bracket 38a, 38b is coupled between the exposed distal portion of the shield conductor 18 and a respective one of the shield contacts or pads 30a, 30b. For example, a first mounting bracket portion 38a includes a base 40a aligned with the horizontal engagement surface 26 and coupled to one of the shield contacts 30a. The first mounting bracket portion 38a also includes a vertical member 42a integrally formed with the base 40a and extending perpendicularly away from the engagement surface 26. The vertical member 42a is coupled to a portion of the distal end of the exposed shield conductor 18. The first mounting bracket portion 38a is in electrical communication with both the shield conductor 18 and the first shield contact 30a, forming a low impedance electrically conductive path therebetween.

Generally, references to alignment of shielded cables to an engagement or mounting surface (e.g., printed circuit board) refers to alignment of distal end portions of the shielded cables in the immediate vicinity of the mounting surface. There are no intentions to impose restrictions on the routing of more proximal portions of the cable. Additionally, although "vertical" and "perpendicular" are used in exemplary embodiments, it is understood that other cable orientations are applicable. For example, a shielded cable may be aligned at any angle between 0 and 90 degrees with respect to a mounting surface. At least one advantage to non-parallel orientations is an accommodation of more shielded cable terminations per unit surface area. Such space savings accommodate a dense signal routing, useful in semiconductor test applications.

In some embodiments, a second mounting bracket portion 38b also having a base 40b and vertical member 42b is similarly coupled to a portion of the distal end of the exposed shield conductor 18. The second mounting bracket portion 38b is also in electrical communication with both the shield conductor 18 and the second shield contact 30b, forming a low impedance electrically conductive path therebetween. Preferably, or high-frequency applications, combination of the vertical members 42a, 42b of the first and second mounting bracket portions 38a, 38b are coupled to substantially the entire perimeter the exposed distal shield conductor 18, to prevent the leakage of electrical current therethrough.

In some embodiments, an electrically conductive ferrule 44 is coupled between an outer periphery of the exposed distal end of the shield conductor 18 and the vertical members 42a, 42b of the first and second mounting bracket portions 38a, 38b. An adhesive compound 43 can be applied to a portion of the engagement surface 26 in the immediate vicinity of the distal end of the shielded cable 12 to promote a secure attachment of the shielded cable 12 to the printed circuit board 14. The adhesive compound 43 is in communication with one or more of the exposed distal end of the signal conductor 24, an exposed end of the cable insulation 20, the exposed distal end of the shield conductor 18, one or more of the first and second mounting bracket portions 38a, 38b, and one or more of the signal contact 28 and shield contacts 30. Preferably, the adhesive compound 43 is non-conducting, such as an epoxy-based compound. More preferably, the adhesive compound 43 is matched to a structural impedance of the cable-printed circuit board assembly 10.

Figure 2:
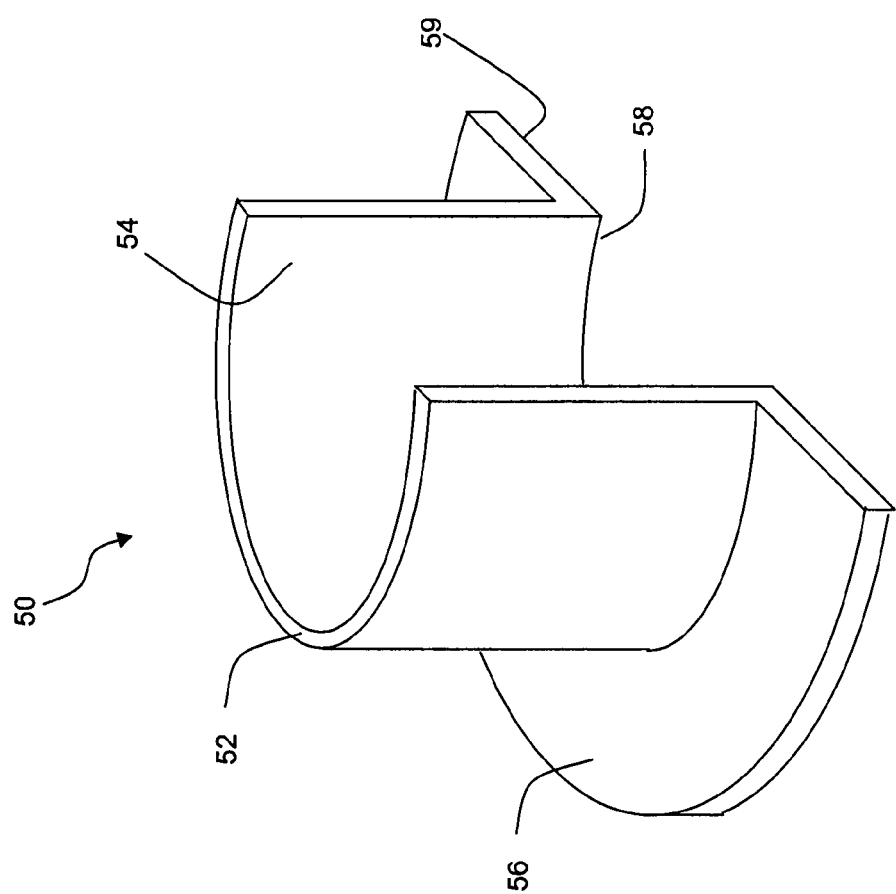
FIG. 2 is a perspective view of an exemplary embodiment of an electrically conductive mounting bracket in accordance with the principles of the present embodiments.

Referring to FIG. 2, a perspective view of an exemplary embodiment of an electrically conductive mounting bracket 50 is shown. The bracket 50 includes a vertical member 52 defining an interior, perpendicular alignment surface 54. The alignment surface 54 is adapted to abut at least one of the exposed distal end of the shield conductor 18 (FIG. 1) and the electrically conductive ferrule 44 (FIG. 1), when included. The mounting bracket 50 also includes a base or footing 56 disposed along a bottom edge 58 of the vertical member 52. The footing 56 is perpendicularly aligned with the vertical member 52 and extends away from the vertical member 52 in an outward direction. Together, the vertical member 52 and the footing 56 form an L bracket. In some embodiments, the footing 56 extends along the entire bottom edge 58 as shown. In other embodiments, the footing 56 extends along one or more sub-regions 59 of the bottom edge 58, leaving gaps therebetween.

Each of the vertical member 52 and the footing 56 are each formed from an electrically conductive material, such as a metal. In some embodiments, the vertical member 52 and the footing 56 are integrally formed together. For example, the mounting bracket 50 can be formed by first cutting a shape from sheet metal stock. The sheet metal cut out can then be bent along a first axis to form the two regions of the L bracket. The sheet metal cutout can be further bent along a radius about perpendicular axis adding contour shaped to engage the shield conductor 18 or ferrule 44. Beneficially, the L-bracket shape configures the cable alignment surface in a perpendicular fashion to the engagement surface 26, thereby promoting perpendicular alignment of a distal end of the shielded cable 12 to the printed circuit board 14.

Figure 3:
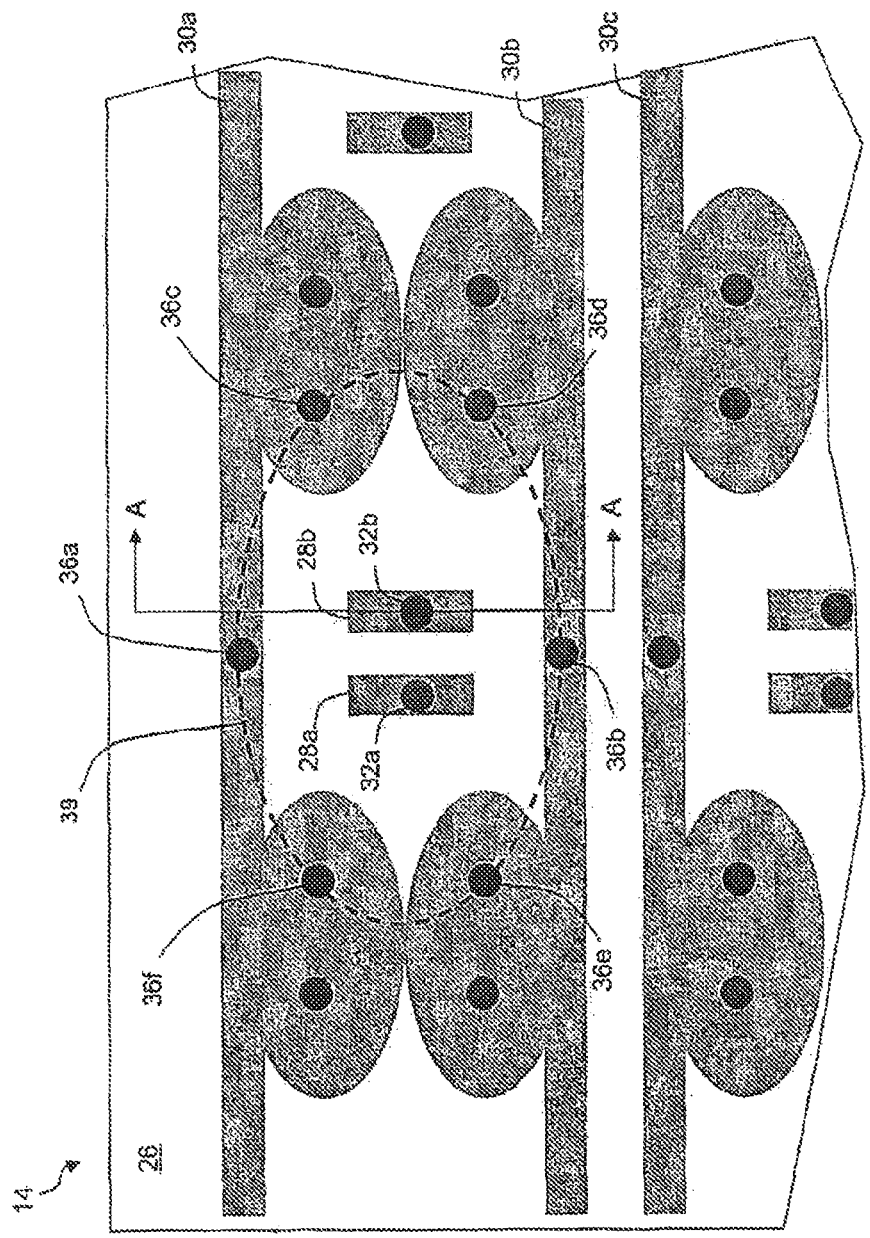
FIG. 3 is a planar view of a portion of an exemplary engagement surface of a planar substrate including electrically conductive shield contacts and electrically conductive signal contacts in accordance with the principles of the present embodiments.

Referring to FIG. 3, a planar view of a portion of an exemplary engagement surface of a printed circuit board 14 is shown including electrically conductive shield contacts 30a, 30b, 30c and electrically conductive signal contacts 28a, 28b formed on the engagement surface. A pair of shield contacts 30a, 30b surround a corresponding pair of signal contacts 28a, 28b. Such a configuration of shield and signal contacts 30a, 30b, 28a, 28b is adapted for a twin axial shielded cable including two internal signal conductors surrounded by a cylindrical cable shield. To promote transfer of signals from the cable signal conductors to the second opposing side of the printed circuit board 14, each of the signal contacts 28a, 28b respectively includes at least one electrically conductive path, or via 32a, 32b (generally 32) viewed end on (see FIG. 1). Similarly, to promote efficient transfer of electrical currents from the cable shield to the second opposing side of the printed circuit board 14, each of the shield contacts 30a, 30b, respectively includes one or more vias 36a, 36b, 36c, 36d, 36e, 36f (generally 36), also viewed end on.

At least one consideration in the positioning of the shield and signal vias 36, 32 on the printed circuit board 14 involves maintaining a characteristic impedance environment vertically through the board 14. Any mismatch or discontinuity in the characteristic impedance of the cable will result in a loss of signal fidelity due at least in part to signal reflections. This can be straightforward in a coaxial cable, where the shield continuously surrounds the center conductor, but is not so simple to solve when transitioning from a shielded cable to a printed circuit board 14. Because the engagement surface 26 is formed on a printed circuit board 14 substrate, forming surface structures on the board 14 through plating and etching techniques are straightforward and relatively inexpensive.

At least one positioning of the shield vias 36 around the signal vias 32 in a precise alignment can be used to accomplish a preferred characteristic impedance, such as 50 Ohms. For a configuration of six shield vias 36 to a two signal via 32 grouping, the ground vias circumscribe an oval 39 (shown in phantom) having a first diameter along a minor axis of about 0.190 inch and a second diameter along a major axis of about 0.250 inch.

Figure 4:
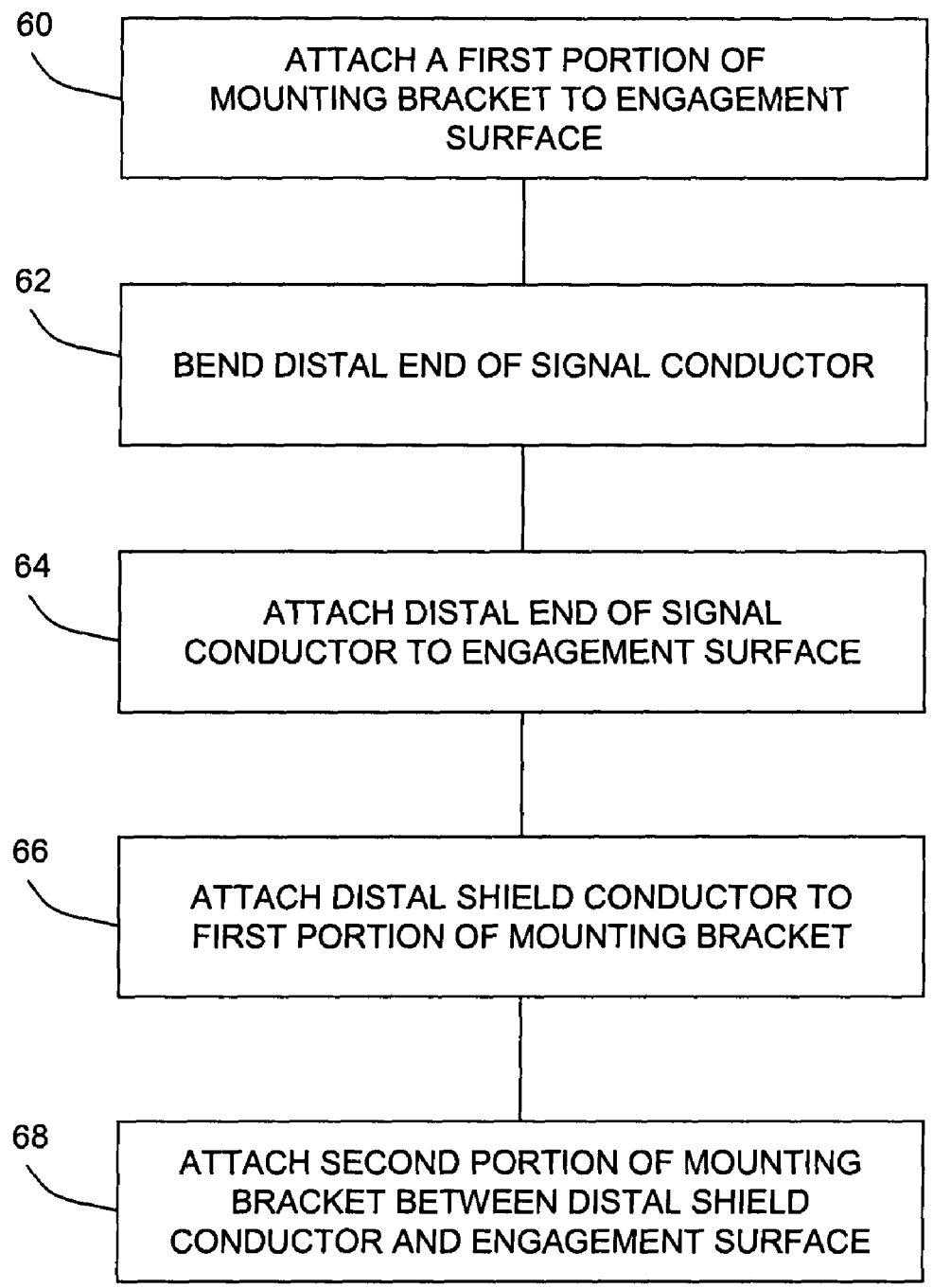
FIG. 4 is a flow diagram of an exemplary process for attaching a distal end of a shielded cable to an engagement surface of a planar substrate in accordance with the principles of the present embodiments.

Referring to FIG. 4, a flow diagram of an exemplary process for attaching a distal end of a shielded cable 12 to an engagement surface 26 of a planar substrate 14 (FIG. 1) is shown. The process includes attaching a first portion of an electrically conductive mounting bracket 38a (FIG. 1) to the engagement surface 26 at Step 60. This can be accomplished by any conventional means of attaching that preserves electrical continuity. For example, a base portion 40a (FIG. 1) of the mounting bracket 38a can be soldered to the first shield contact 30a. Alternatively or in addition, the base portion 40a can be welded to the first shield contact 30a. Laser welding is well suited to welding in such small space as energy can be focused onto the base portion 40a using a high energy beam of light. Such a method of attaching two surfaces is well known to those skilled in the art.

In preparation for attachment to the engagement surface 26, a distal end of the internal signal conductor 16 (FIG. 1) is bent to be substantially perpendicular to a central axis of the shielded cable 12 at Step 62. The bent distal end 24 (FIG. 1) of the internal signal conductor 16 is attached to the engagement surface 26 at Step 64. When attached, the central axis of the shielded cable 12 is substantially perpendicular to the engagement surface 26. The distal end 24 of the signal conductor 16 can also be attached to the corresponding signal contact 28 by soldering. When soldering is also used to attach the first mounting bracket 38a, a lower melting point solder is used, such that the application of heat to the bent distal end 24 does not disrupt the attachment already made to the first mounting bracket 38a. Alternatively or in addition, laser welding can also be used to establish attachment of the bent distal end 24 to the signal contact 28.

A distal portion of the external shield conductor 18 (FIG. 1) is attached to the first portion of the electrically conductive mounting bracket 38a at Step 66. Finally, a second portion of an electrically conductive mounting bracket 38b (FIG. 1) is attached to the distal portion of the external shield conductor 18 and the engagement surface 26 at Step 68. When completed, the distal end of the shielded cable 12 is vertically aligned with and securely attached to the engagement surface 26. Once again, soldering, laser welding, or a combination of soldering and laser welding can be used to make each of the attachments. When solder is used for more than one of the attachments, solders having lower melting points are used for subsequent attachments so as not to disturb earlier attachments.

Figure 5A:
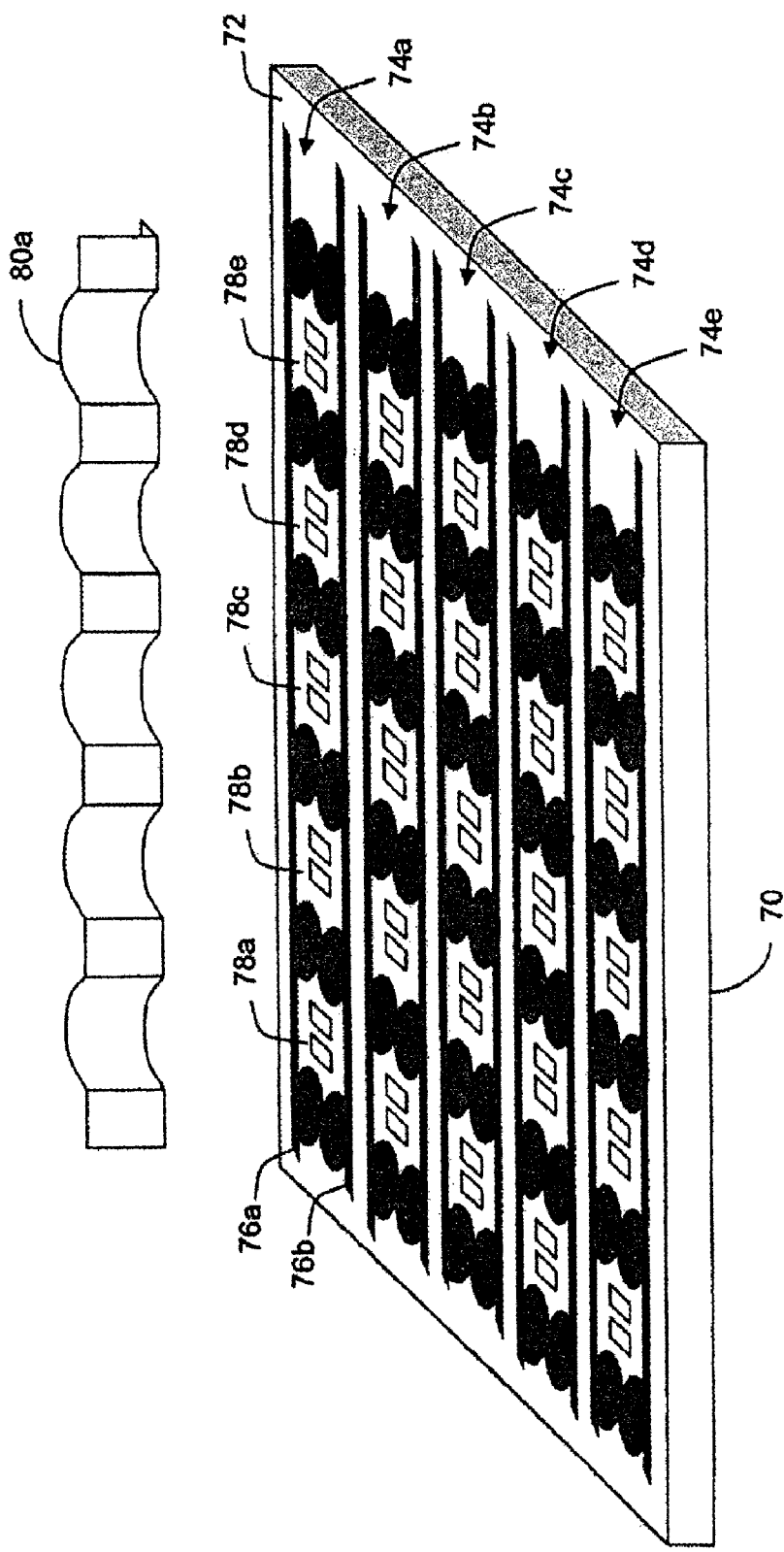
FIGS. 5A through 5H are perspective diagrams of an exemplary shielded cable assembly during various stages of construction, the shielded cable assembly constructed in accordance with the principles of the present embodiments.

Referring to FIGS. 5A through 5H, perspective diagrams of an exemplary shielded cable assembly is shown during various stages of construction. In FIG. 5A, an exemplary printed circuit board 70 is shown. The printed circuit board 70 includes an engagement surface 72 with a number of different contacts formed thereon. In the exemplary embodiment, the engagement surface includes five pairs of shield contacts 74a, 74b, 74c, 74d, 74e (generally "74"), with each pair 74 including opposing shield contacts 76a, 76b. Also disposed between each of the pairs of shield contacts 74 are five pairs of signal contacts 78a, 78b, 78c, 78d, 78e (generally "78"). Thus, the exemplary engagement surface 72 is adapted to attach to a rectangular 5×5 array of 25 shielded twinaxial cables (not shown). Other array shapes are possible, such as hexagonal arrays and spiral arrays. A first electrically conductive mounting bracket 80a is positioned in alignment with a first opposing shield contact 76a of the first pair of shield contacts 74a.

Figure 5B:
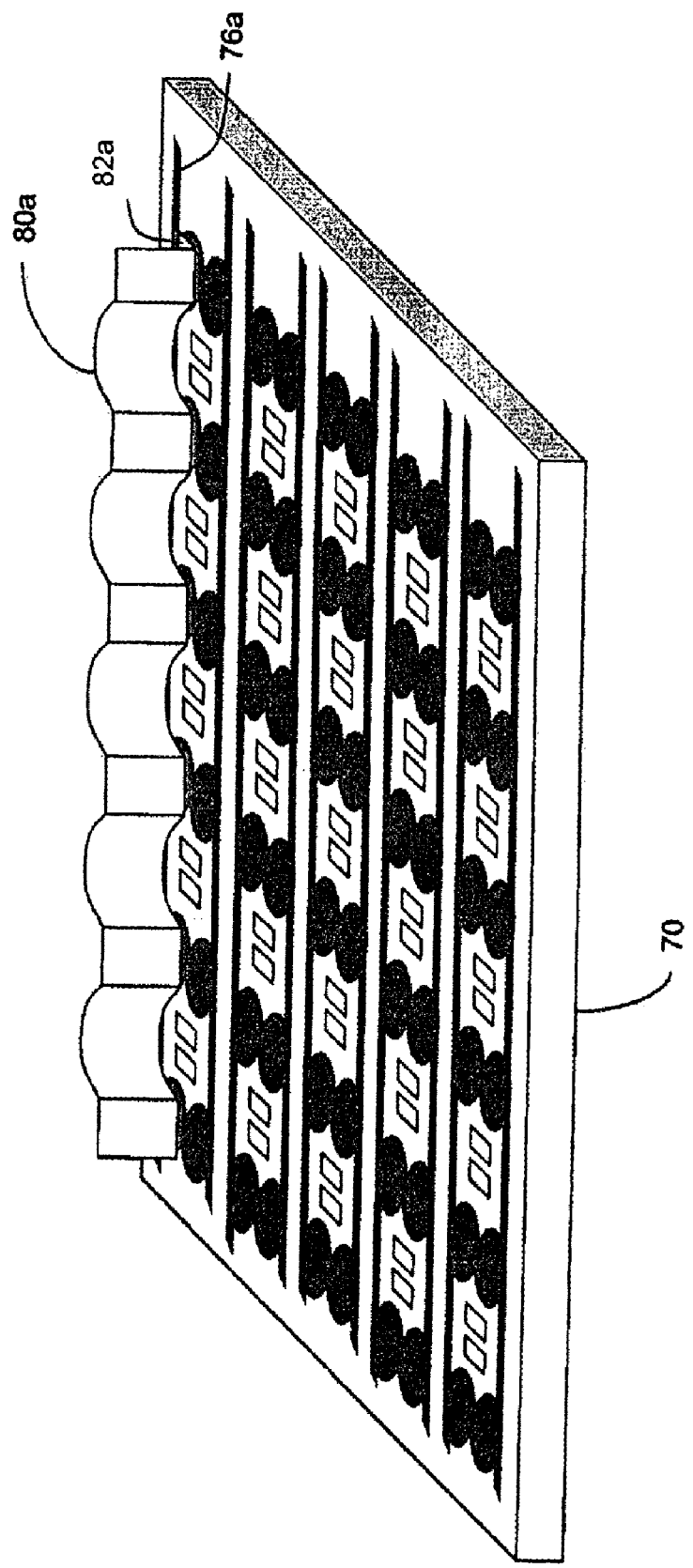
Figure 5C:
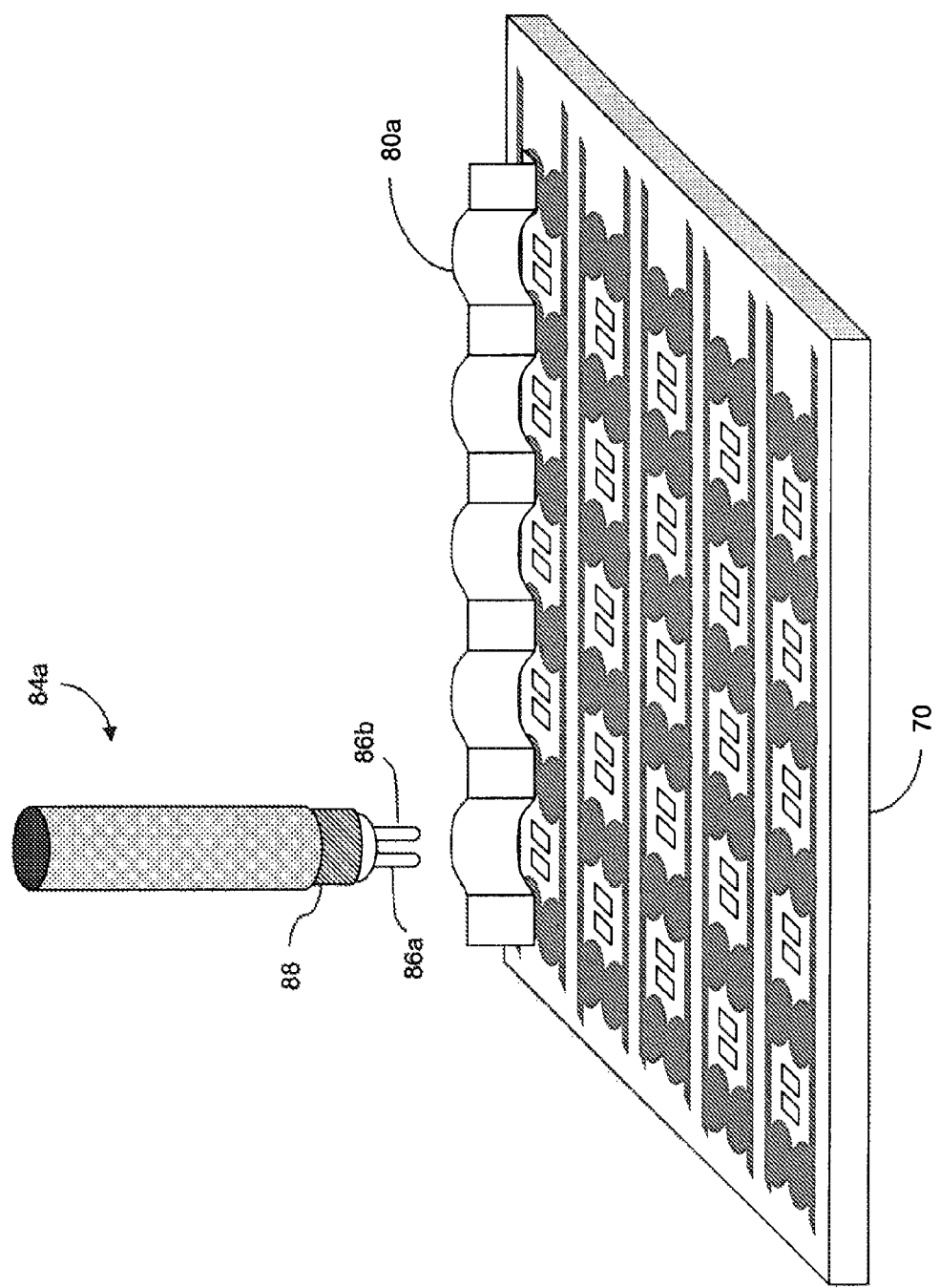
Figure 5D:
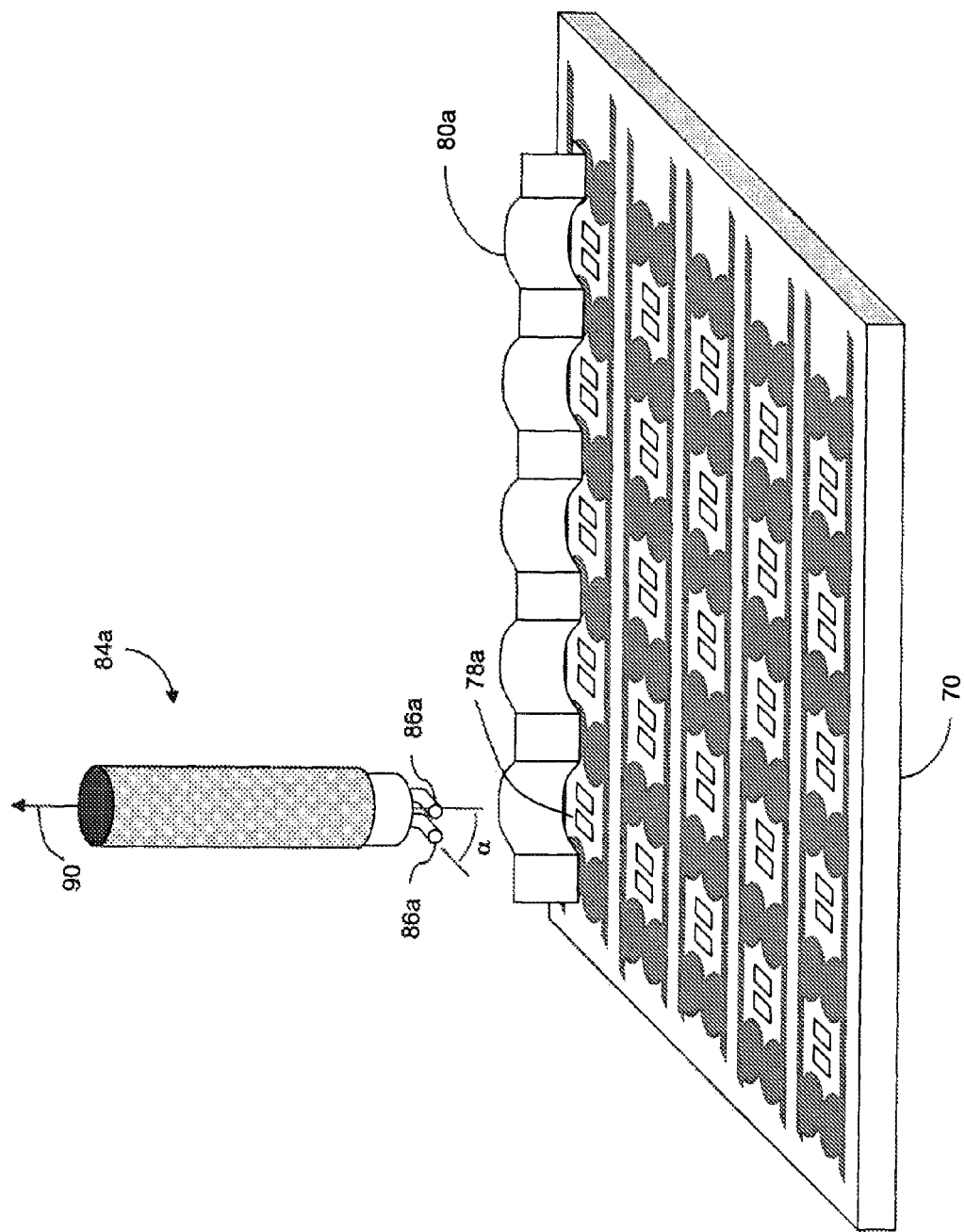

Referring to FIG. 5B, the first mounting bracket 80a, also referred to as a grounding fence 80a, includes a base portion 82a. The base portion 82a is attached to and in electrical communication with the first opposing shield contact 76a. Referring to FIG. 5C, a first shielded twinaxial cable 84a is suitably prepared by exposing distal ends of the two internal signal conductors 86a, 86b and a distal portion of the shield conductor 88. As shown in FIG. 5D, the end portions of the two exposed distal ends of the internal signal conductors 86a, 86b are each bent to an angle α of about 90 degrees measured from the cable axis 90. The pair of bent signal conductor ends 86a, 86b are aligned above a respective pair or signal contacts 78a.

Figure 5E:
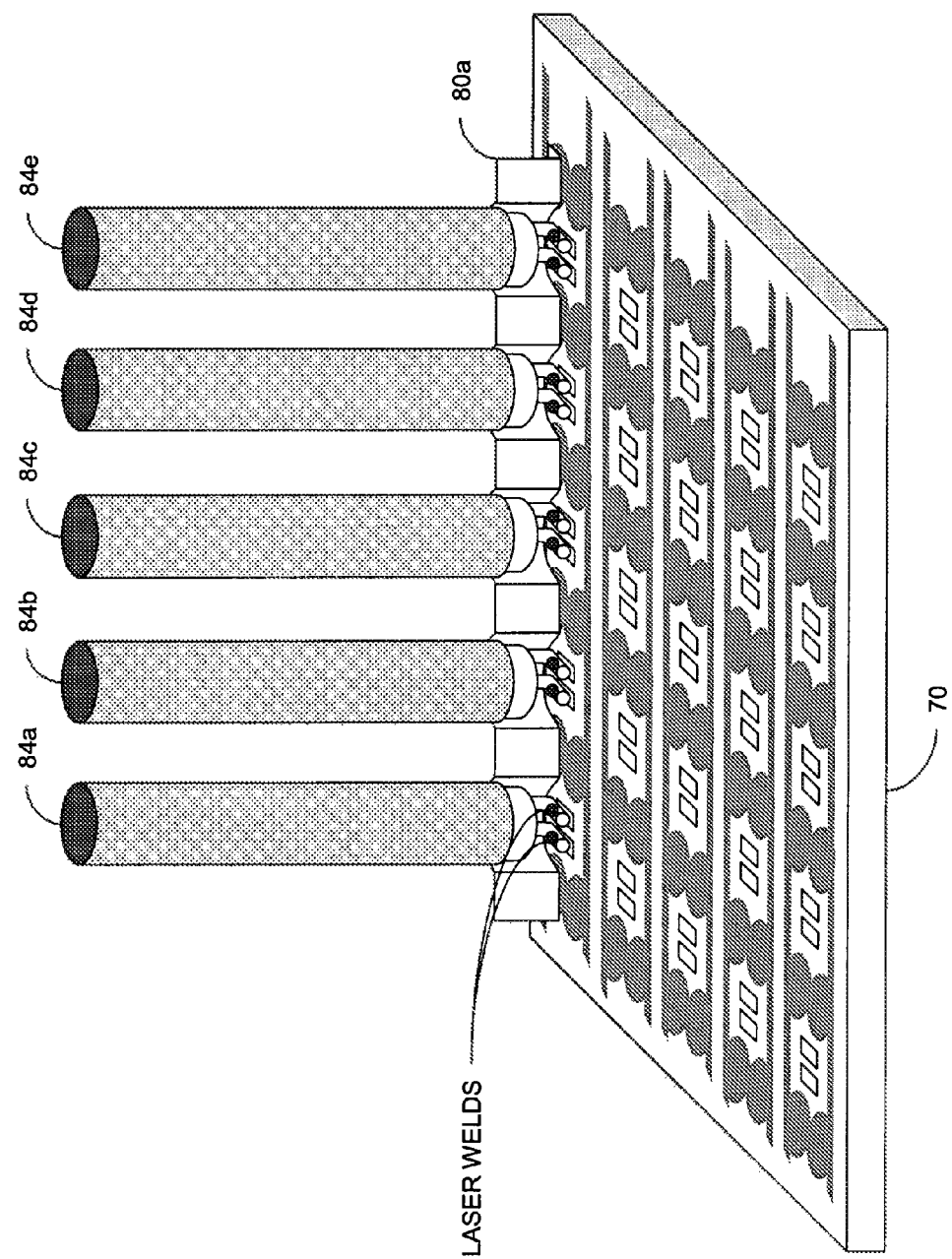
Figure 5F:
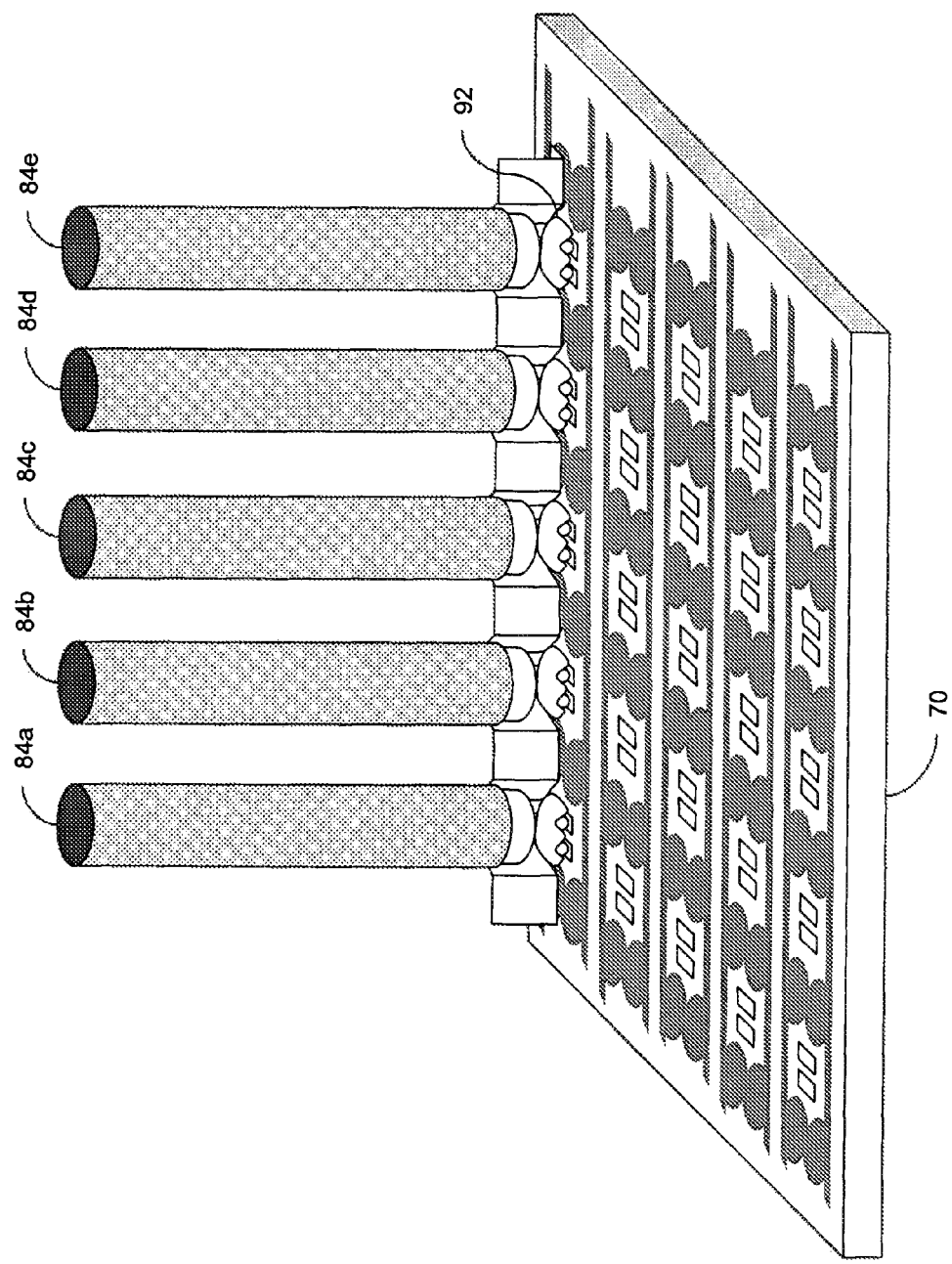

As shown in FIG. 5E, the signal conductor ends 86a, 86b are coupled to and in electrical communication with the respective pair of signal contacts 78a using any of the attachment techniques described herein. The process is repeated for each of the remaining four cables 84b, 84c, 84d, 84e (generally "84") forming a first row of attached cables 84. In some embodiments, referring to FIG. 5F, an adhesive compound, such as a non-conductive epoxy 92 is applied to the signal conductor ends 86a, 86b and surrounding engagement surface for each of the cables 84. Care can be taken to ensure that the applied epoxy 92 does not interfere with later attachment of a second portion of the cable shield or ground fence.

Figure 5G:
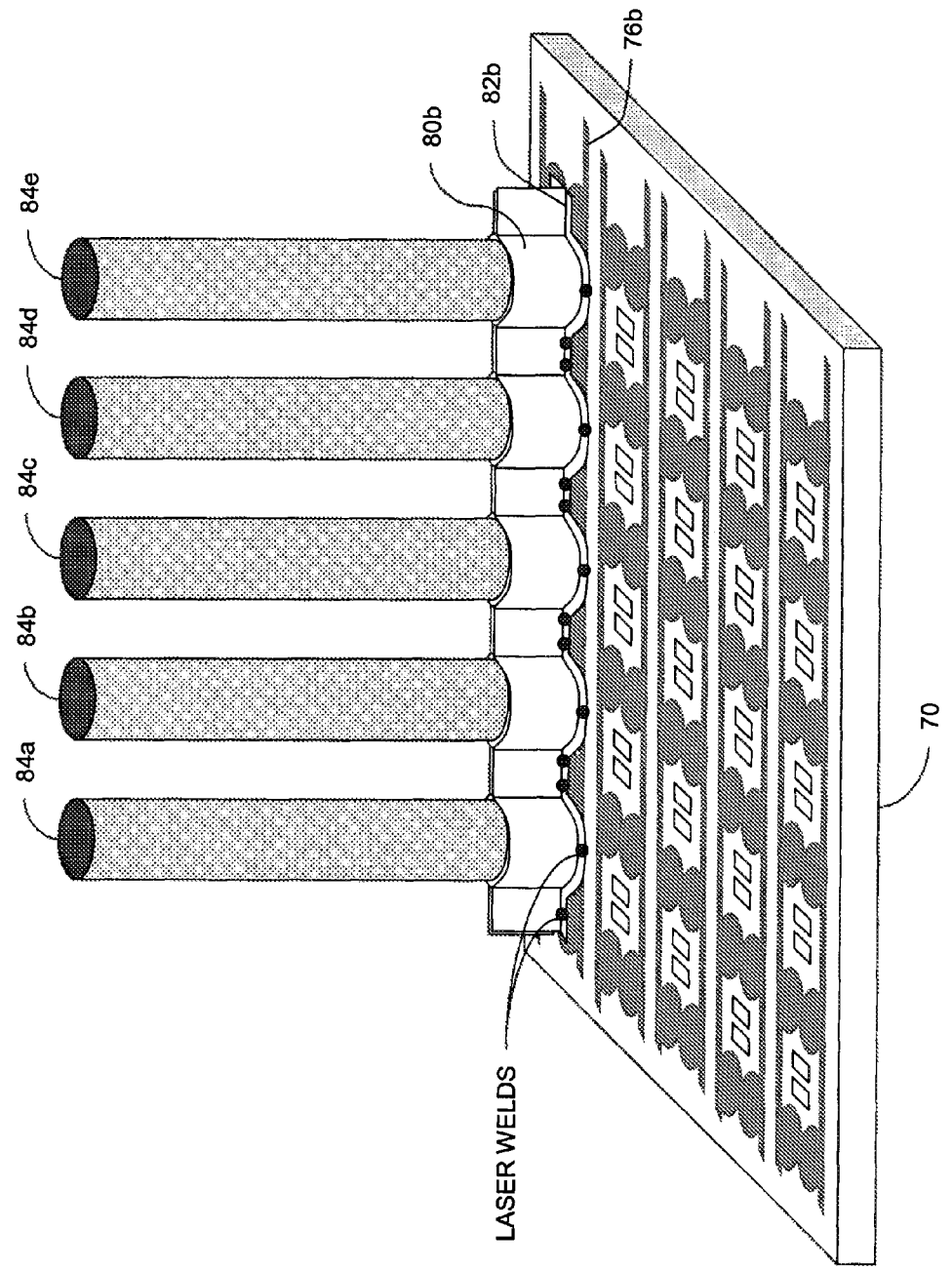
Figure 5H:
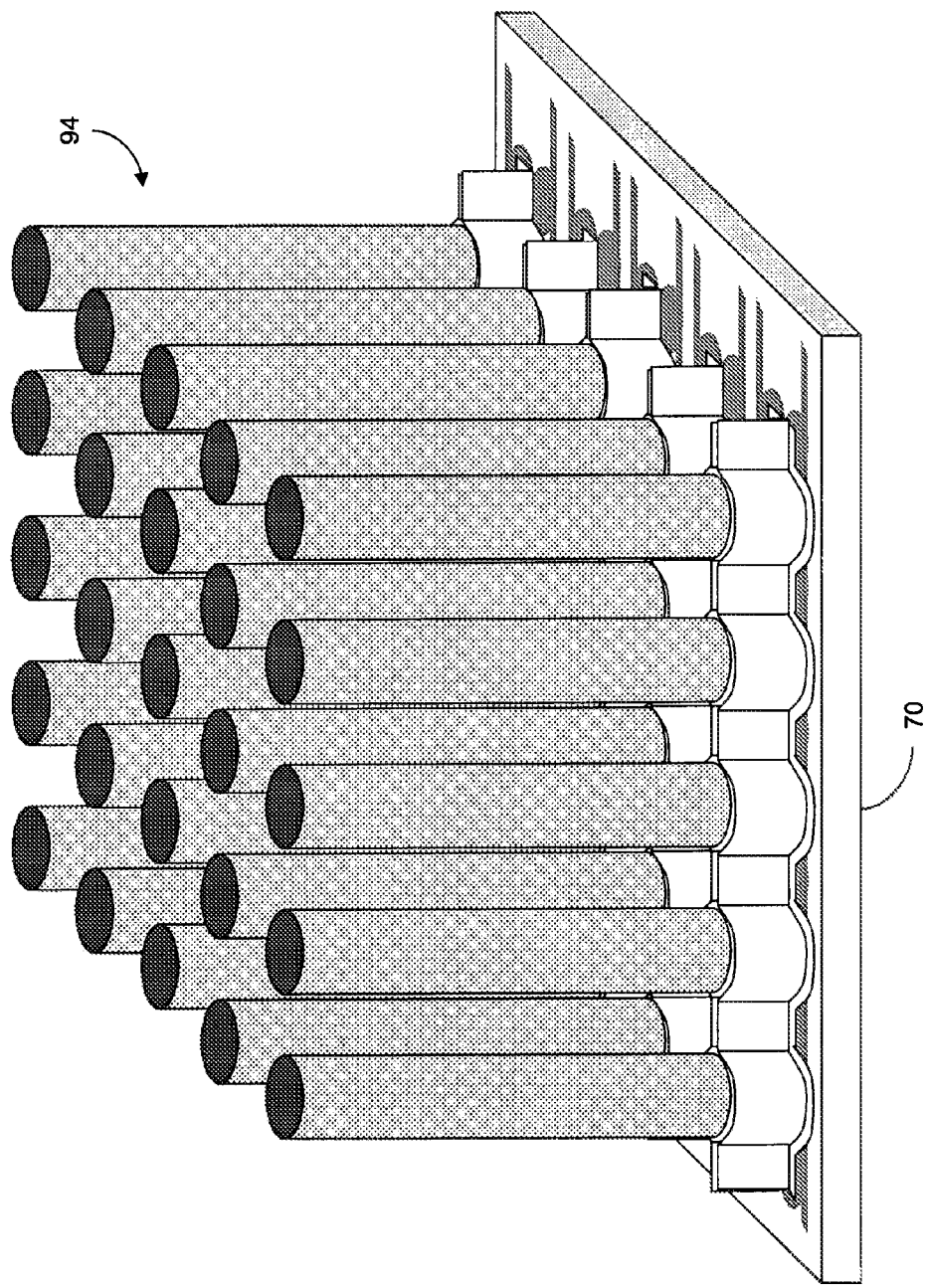

As shown in FIG. 5G, a second ground fence 80b is attached to a second one of the shield contacts 76b and to an opposite side of each distal end of the cables 84. The second ground fence 80b also includes a base portion, or footing 82b that is attached to and in electrical communication with the second shield contact 76b. The second grounding fence can be attached to one or more of the exposed shield conductors 88 (not shown) and the shield contact 76b using any of the electrically conductive attachment means described herein. Referring to FIG. 5H, the process illustrated in FIGS. 5A through 5G can be repeated for the remaining four rows of cables in the exemplary 5-row assembly resulting in a cable assembly 94 including a dense array of 25 shielded cables, each perpendicularly coupled to one side of a printed circuit board 70.

Those skilled in the art will appreciate the many benefits and advantages afforded by embodiments of the present invention. In particular, funneling large arrays of conductors from a low-density array to a high-density array may be accomplished by an efficient and highly manufacturable method. Additionally, by enabling the use of impedance-matched transmission lines with low dielectric as signal conductors, signal fidelity can be maximized over a wide bandwidth passing beyond several gigahertz.

While this invention has been particularly shown and described with references to preferred embodiments thereof, it will be understood by those skilled in the art that various changes in form and details may be made therein without departing from the scope of the invention encompassed by the appended claims.

What is claimed is:

1. A shielded cable assembly comprising:
   a planar substrate including an engagement surface, the engagement surface having at least one electrically conductive signal contact and at least one separate electrically conductive shield contact;
   a shielded cable having at least one internal conductor and an external shield conductor, a distal end of the at least one internal conductor extending beyond a distal end of the external shield conductor, but not extending beyond the engagement surface, wherein the distal end of the at least one internal conductor includes a bend and is attached to and in electrical communication with the at least one electrically conductive signal contact; and
   an electrically conducting mounting bracket attached between and in electrical communication with each of the distal end of the external shield conductor and the at least one separate electrically conductive shield contact, a distal end of the shielded cable being securely attached and substantially perpendicular to the engagement surface.

2. The shielded cable assembly of claim 1, further comprising:
   an electrically conductive signal path from the at least one electrically conductive signal contact to a second surface of the planar substrate, the second surface being opposite to the engagement surface; and
   an electrically conductive shield path from the at least one separate electrically conductive shield contact to the second surface of the planar substrate.

3. The shielded cable assembly of claim 2, wherein the electrically conductive shield path is a first electrically conductive shield path and wherein the shielded cable assembly further comprises a plurality of electrically conductive shield paths from the at least one separate electrically conductive shield contact to the second surface of the planar substrate, and wherein the plurality of electrically conductive shield paths includes the first electrically conductive shield path, the electrically conductive signal path and the plurality of electrically conductive shield paths together forming a structure having a controlled impedance.

4. The shielded cable assembly of claim 1, wherein the at least one electrically conductive signal contact comprises at least two electrically conductive signal contacts,
   wherein the at least one internal conductor comprises at least two internal conductors including a first internal conductor and a second internal conductor,
   wherein respective distal ends of the first and second internal conductors extend beyond the distal end of the external shield conductor, and
   wherein each of the respective distal ends of the first and second internal conductors includes a respective bend and is attached to and in electrical communication with a respective one of the at least two electrically conductive signal contacts.

5. The shielded cable assembly of claim 1, further comprising an adhesive compound in communication with the distal end of the at least one internal conductor and an adjacent region of the engagement surface, the adhesive compound reinforcing attachment of the distal end of the shielded cable to the engagement surface.

6. The shielded cable assembly of claim 1, wherein the electrically conducting mounting bracket comprises first and second mounting bracket components each disposed on respective sides of the distal end of the external shield conductor and providing a perpendicular alignment surface configured to hold the distal end of the shielded cable in perpendicular alignment with the engagement surface.

7. The shielded cable assembly of claim 6, wherein at least one of the first and second mounting bracket components is formed from sheet metal.

8. The shielded cable assembly of claim 6, wherein at least one of the first and second mounting bracket components comprises a footing defining a planar surface aligned with the engagement surface and forming an 'L' bracket with the perpendicular alignment surface.

9. The shielded cable assembly of claim 1, wherein:
the at least one electrically conductive signal contact comprises a plurality of electrically conductive signal contacts; and
the shielded cable is a first shielded cable, the distal end of the shielded cable is a first distal end, the external shield conductor is a first external shield conductor, the at least one internal conductor is a first internal conductor and the distal end of the at least one internal conductor is a first distal end of the first internal conductor, and wherein the shielded cable assembly further comprises a plurality of shielded cables including the first shielded cable, each of the plurality of shielded cables having:
a respective distal end substantially perpendicular to the engagement surface,
a respective at least one internal conductor having a respective distal end aligned with the engagement surface, and
a respective external shield conductor.

10. The shielded cable assembly of claim 9, wherein:
the at least one separate electrically conductive shield contact comprises a plurality of electrically conductive shield contacts;
the electrically conducting mounting bracket comprises a plurality of electrically conducting mounting brackets; and
each of the plurality of electrically conducting mounting brackets is coupled between the respective distal end of at least one of the plurality of shielded cables and at least one of the plurality of electrically conductive shield contacts, the plurality of electrically conducting mounting brackets supporting perpendicular alignment of the plurality of shielded cables to the planar substrate.

11. The shielded cable assembly of claim 10, wherein the shielded cable assembly further comprises an ATE interface adapted to couple high-frequency tester channels through the plurality of shielded cables to a device-under test.

12. The shielded cable assembly of claim 9, wherein the electrically conducting mounting bracket supports perpendicular alignment of the plurality of shielded cables to the planar substrate.

13. The shielded cable assembly of claim 12, wherein the shielded cable assembly further comprises an ATE interface adapted to couple high-frequency tester channels through the plurality of shielded cables to a device-under test.

14. An automatic test equipment (ATE) interface for coupling high-frequency tester channels to a device-under test, the interface including:
a printed circuit board having an engagement surface and a planar surface opposite to the engagement surface, the engagement surface including a plurality of signal contacts and a plurality of shield contacts;
a plurality of shielded cables, each of the plurality of shielded cables having at least one internal conductor, an external shield conductor, and a distal end substantially perpendicular to the engagement surface of the printed circuit board, a distal end of the at least one internal conductor substantially parallel to the engagement surface and surface mounted to the engagement surface; and
a plurality of electrically conducting mounting brackets, each of the plurality of electrically conducting mounting brackets coupled between the distal end of at least one of the plurality of shielded cables and at least one of the plurality of shield contacts, the plurality of electrically conducting mounting brackets supporting perpendicular alignment of the plurality of shielded cables to the engagement surface,
wherein the ATE interface is configured to couple high-frequency tester channels through the plurality of shielded cables to the device-under test.

15. The shielded cable assembly of claim 14, wherein the planar surface of the printed circuit board is adapted for interconnecting to an interposer.

16. The shielded cable assembly of claim 14, wherein for a first shielded cable of the plurality of shielded cables, the at least one internal conductor comprises at least two internal conductors.

17. A shielded cable assembly comprising:
a printed circuit board having a first planar surface including a plurality of signal contacts and a plurality of shield contacts and a second planar surface opposite to the first planar surface;
a plurality of shielded cables, each of the plurality of shielded cables having at least one internal conductor and an external shield conductor and a distal end substantially perpendicular to the first planar surface of the printed circuit board, wherein a distal end of the at least one internal conductor is substantially parallel to the first planar surface and is mounted to the first planar surface without a through bore; and
a plurality of electrically conducting mounting brackets, each of the plurality of electrically conducting mounting brackets coupled between the distal end of at least one of the plurality of shielded cables and at least one of the plurality of shield contacts, the plurality of electrically conducting mounting brackets supporting perpendicular alignment of the plurality of shielded cables to the first planar surface.

18. The shielded cable assembly of claim 17, wherein the second planar surface of the printed circuit board is adapted for interconnecting to an interposer.

19. The shielded cable assembly of claim 17, wherein the at least one internal conductor of at least one of the plurality of shielded cables comprises at least two internal conductors.

20. A shielded cable assembly comprising:
means for attaching a first portion of an electrically conductive mounting bracket to an engagement surface;
means for attaching a bent distal end of an internal conductor to the engagement surface, the bent distal end substantially perpendicular to a central axis of a shielded cable including the internal conductor, the central axis of the shielded cable being substantially perpendicular to the engagement surface, and the bent distal end not extending beyond the engagement surface;
means for attaching a distal portion of an external shield conductor of the shielded cable to the first portion of the electrically conductive mounting bracket; and
means for attaching a second portion of the electrically conductive mounting bracket to the distal portion of the external shield conductor and the engagement surface.

* * * * *